(12) United States Patent
Lusky (10) Patent No.: US 7,339,826 B2
(45) Date of Patent: Mar. 4, 2008

(54) THRESHOLD VOLTAGE SHIFT IN NROM CELLS

(75) Inventor: Eli Lusky, Tel Aviv (IL)

(73) Assignee: Saifun Semiconductors Ltd., Netanya (IL)

( * ) Notice: Subject to any disclaimer, the term of this patent is extended or adjusted under 35 U.S.C. 154(b) by 248 days.

(21) Appl. No.: 11/103,367

(22) Filed: Apr. 11, 2005

(65) Prior Publication Data

US 2006/0227608 A1    Oct. 12, 2006

(51) Int. Cl.
*G11C 11/34* (2006.01)

(52) U.S. Cl. .......................... 365/185.14; 365/185.05; 365/185.24; 365/201

(58) Field of Classification Search ........... 365/185.14, 365/185.05, 185.24, 201
See application file for complete search history.

(56) References Cited

U.S. PATENT DOCUMENTS

| | | | |
|---|---|---|---|
| 7,116,577 B2* | 10/2006 | Eitan | 365/185.03 |
| 7,164,603 B2* | 1/2007 | Shih et al. | 365/185.18 |
| 7,209,390 B2* | 4/2007 | Lue et al. | 365/185.19 |
| 7,242,622 B2* | 7/2007 | Hsu et al. | 365/185.29 |
| 2004/0136220 A1 | 7/2004 | Cohen | |
| 2005/0111257 A1* | 5/2005 | Eitan | 365/185.05 |

OTHER PUBLICATIONS

M. Specht, et al. "Novel Dual Bit Tri-Gate Charge Trapping Memory Devices", IEEE Electron Device Letters vol. 25, No. 12, Dec. 12, 2004.
U.S. Appl. No. 11/007,332, Maayan et al.
U.S. Appl. No. 10/695,449, Cohen et al.

* cited by examiner

*Primary Examiner*—Tuan T. Nguyen
(74) *Attorney, Agent, or Firm*—EMPK & Shiloh, LLP (57) ABSTRACT

An NROM (nitride read only memory) cell, which is programmed by channel hot electron injection and erased by hot hole injection, includes a charge trapping structure formed of: a bottom oxide layer, a charge trapping layer; and a top oxide layer. The bottom oxide layer is no thicker than that which provides margin stability.

6 Claims, 7 Drawing Sheets

FIG.1

Prior Art

FIG.2

Prior Art

FIG.3

Prior Art

THRESHOLD VOLTAGE SHIFT IN NROM CELLS

FIELD OF THE INVENTION

The present invention relates to NROM cells generally and to threshold voltage shifts therein in particular.

BACKGROUND OF THE INVENTION

Figure 1:
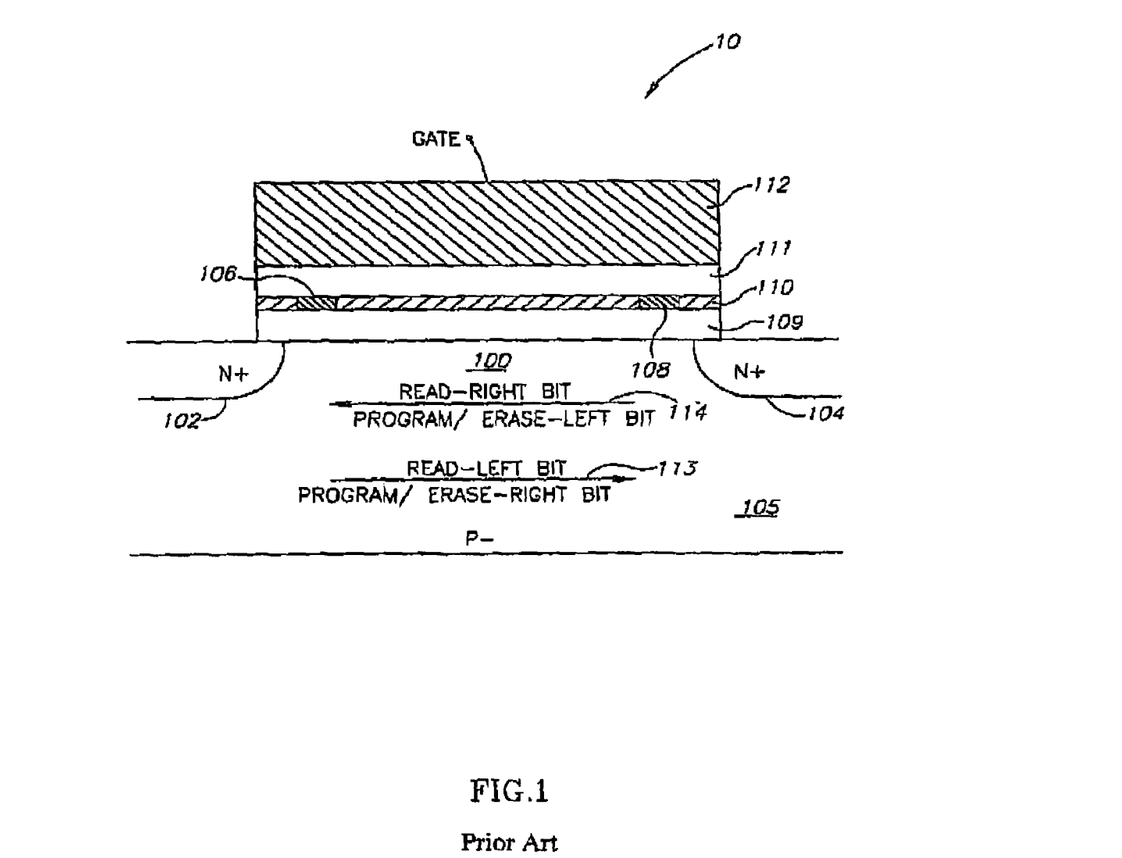
FIG. 1 is an illustration of a prior art NROM cell.

Nonvolatile charge trapping layer devices, such as nitride read only memory (NROM), are known in the art. FIG. 1, to which reference is now made, shows an exemplary NROM cell 10. The NROM cell has a channel 100 in a substrate 105 between two bit lines 102 and 104 and an oxide-nitride-oxide (ONO) sandwich underneath gate 112. The oxide-nitride-oxide sandwich has a top oxide layer 111, typically of 10-17 nm thickness, a middle nitride layer 110, typically of 4-8 nm thickness, and a bottom oxide layer 109, typically of 4-8 nm thickness. The NROM cell may contain a chargeable area 106, defining one bit, located within middle nitride layer 110. A dual bit NROM cell may contain two separated and separately chargeable areas 106 and 108 located within middle nitride layer 110.

Bits 106 and 108 are individually accessible, and thus, may be programmed (conventionally noted as a '0'), erased (conventionally noted as a '1') or read separately. Typically, programming and erasure of an NROM cell is performed with pulses of voltage on the drain, either bit line 102 or 104, and on the gate 112. After each pulse, a verify operation is performed in which the state of the cell is measured. Programming and verify operations continue until the cell will not pass any significant current during a read operation. During erasure, the opposite is true; erase and verify operations continue until a significant current is present in the cell during reading.

Reading a bit (106 or 108) involves determining if a threshold voltage $V_t$, as seen when reading the particular bit, is above (programmed) or below (erased) a read reference voltage level RD.

Figure 2:
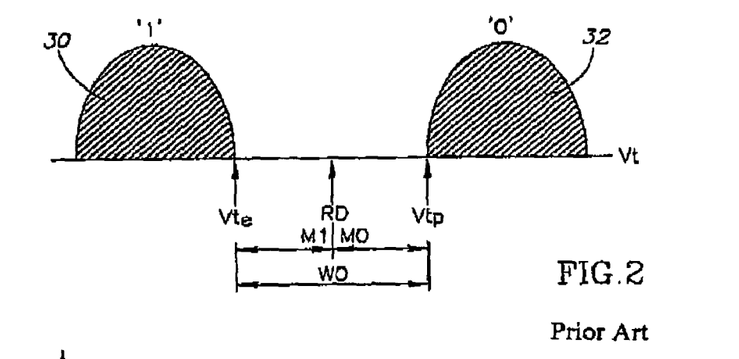
FIG. 2 is an illustration of the distribution of programmed and erased states of a memory chip comprised of a large multiplicity of NROM cells.

FIG. 2, to which reference is now made, illustrates the distribution of programmed and erased states of a memory chip (which typically has a large multiplicity of NROM cells formed into a memory array) as a function of threshold voltage $V_t$. There is an erase distribution 30, below a read level RD, whose rightmost point is an erase threshold voltage $V_{tc}$. Similarly, there is a program distribution 32 above read level RD whose leftmost point is a programmed threshold voltage $V_{tp}$.

The distance separating the two threshold voltages $V_{tp}$ and $V_{tc}$ is a window of operation WO. Window of operation WO is comprised of margins M0 and M1 as shown in FIG. 2. Margin M0 is the distance between read reference voltage level RD and program threshold voltage $V_{tp}$. Margin M1 is the distance between read reference voltage level RD and the erase threshold voltage $V_{tc}$. The distance at which program threshold voltage $V_{tp}$ is kept from erase threshold voltage $V_{tc}$ by margins M0 and M1 ensures that reads of '0' and '1' (indicating a programmed cell state and an erased cell state respectively) are accurate. As long as the margins are sufficiently large, reliable reads may be achieved.

Figure 3:
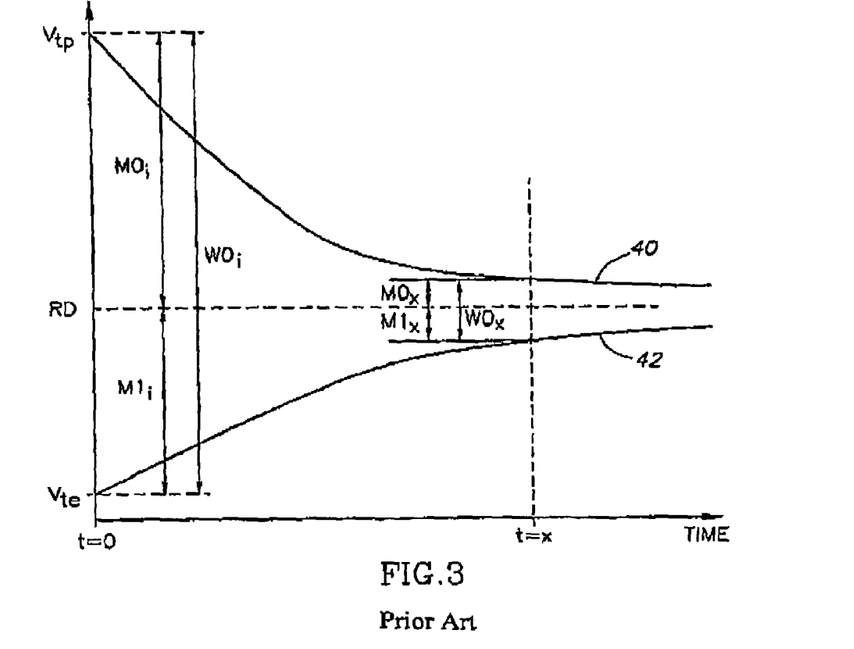
FIG. 3 is a graphical illustration of the typical behavior of an NROM cell after bake treatment following multiple cycles of programming and erasing.

Unfortunately, the margins may change significantly over time, which can cause a cell to cease operating. For example, as shown in FIG. 3 to which reference is now made, margins may shrink upon "Bake" treatment. In a Bake treatment, the cell is exposed to elevated temperatures in order to emulate the ability of a cell to retain information over an extended period of time and is one of a number of tests, performed on a memory array prior to its release as a commercial product FIG. 3 plots threshold voltages $V_{tp}$ and $V_{tc}$ against time for an exemplary NROM cell after multiple cycles of programming and erasing. As shown in FIG. 3, the initial window of operation, $WO_i$, and initial margins, $M0_i$ and $M1_i$, are shown at t=0. At a later time, t=x, the margins $M0_x$ and $M1_x$ are seen to be reduced. Eventually, margins M0 and M1 and window of operation WO may shrink to such an extent that it may no longer be possible to achieve reliable reads and thus, the NROM cell will cease to be reliable. Thus, margin shrinkage, which may occur during the life of the product, is a limiting factor in the useful product life of an NROM cell.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that the product life of NROM cells may be extended if margin change, which may occur following bake or positive gate stress after repeated cycles of programming and erasure, is reduced and a stable window of operation is maintained. Applicant has discovered that NROM cells having a thin bottom oxide layer may exhibit minimal margin change and a stable window of operation.

Figure 4:
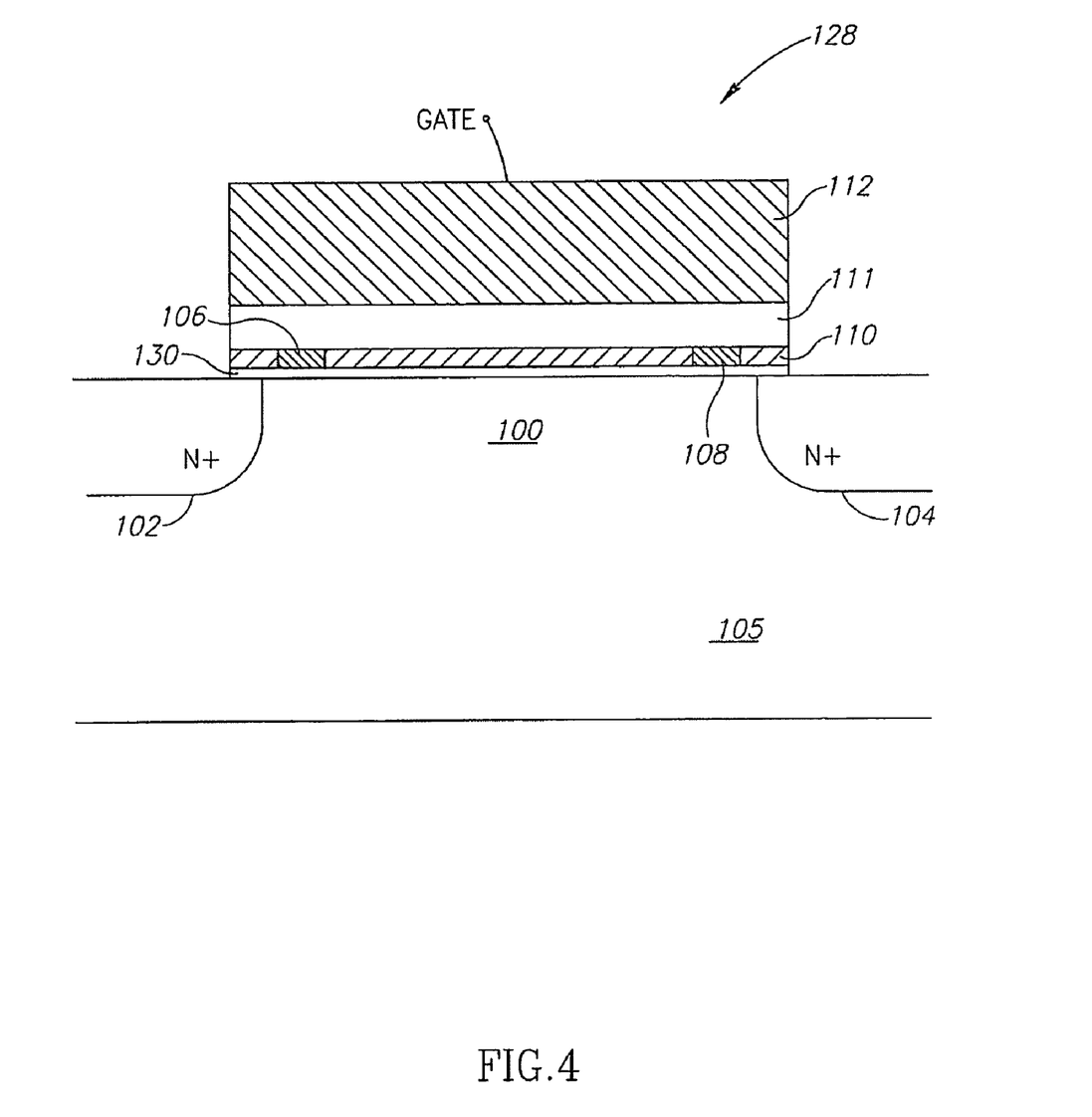
FIG. 4 is an illustration of an innovative NROM cell, constructed and operative in accordance with a preferred embodiment of the present invention.

Reference is now made to FIG. 4 showing an innovative NROM cell 128, with a thin bottom oxide, here labeled 130. The other components of NROM cell 128 may be substantially the same as in the prior art NROM and are referenced with the same reference numerals as in FIG. 1.

In NROM cell 128, bottom oxide layer 130 may have the thinnest possible thickness, while the remaining layers 110 and 111 may maintain the same thicknesses as in the prior art. For example, the thickness of bottom oxide layer 130 may be no thicker than that which provides margin stability after repeated cycling. For example, for the technology of the year 2004, bottom oxide layer 130 may have an exemplary thickness of 2.5-3.5 nm, while top oxide layer 111 and middle nitride layer 110 may have the same thicknesses as in the prior art, i.e. of 10-17 nm and 4-8 nm respectively.

Margin stability after repeated cycles of programming and erasure may be tested by a gate stress test or a balance treatment. Gate stress tests emulate continuous read operations or positive gate bias during the programming portion of program and erase operations.

Figure 5A:
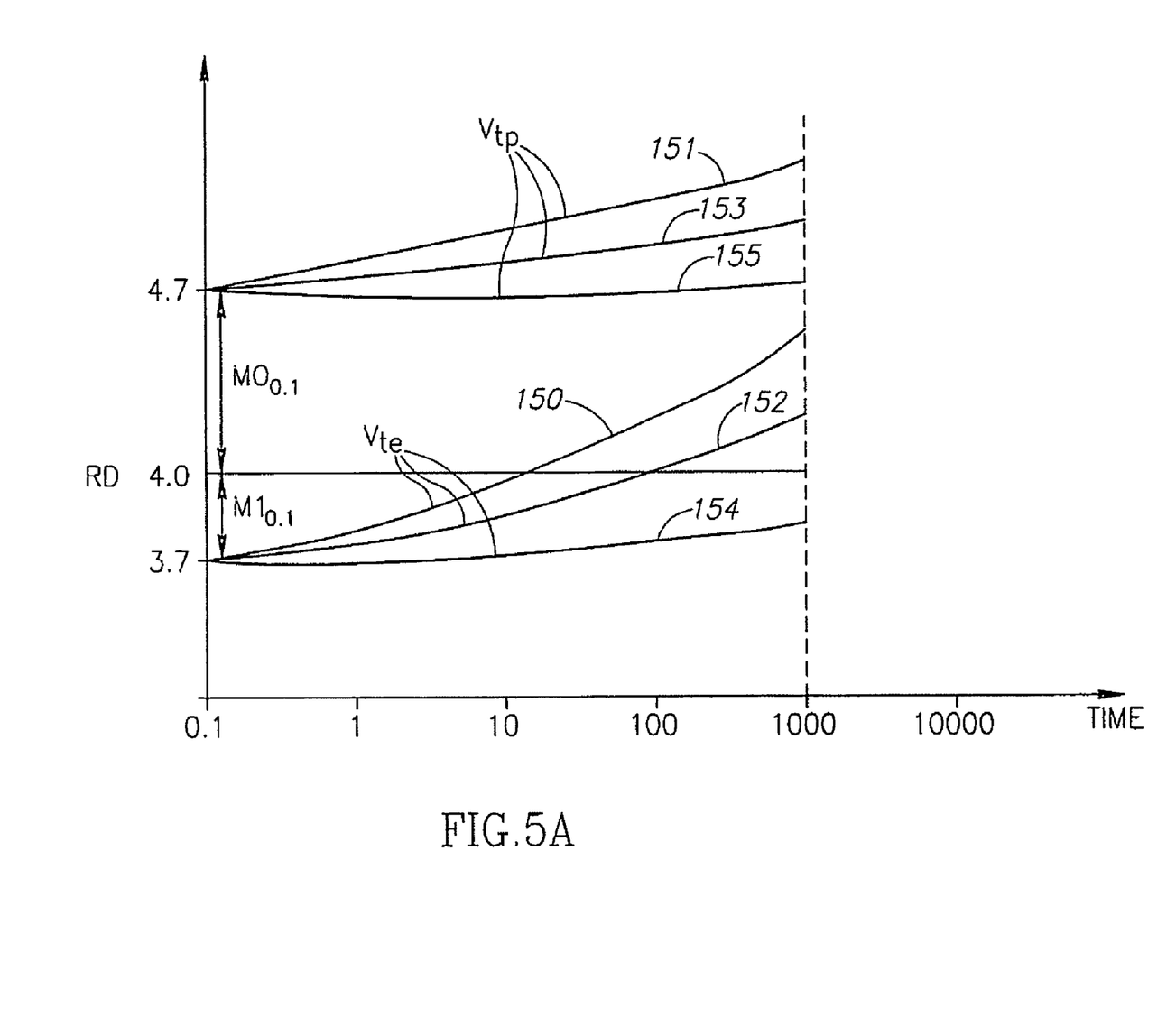
FIG. 5A is a graphical illustration of erase and programmed threshold voltage shifts exhibited by NROM cells having different ONO structures as a result of positive gate stress following multiple cycles of programming and erasing.

The results of one exemplary gate stress test are shown in FIG. 5A, to which reference is now made. FIG. 5A shows a comparison of the positive gate stress sensitivities of three different ONO structures of NROM cells after multiple cycles of programming and erasure. Erase threshold voltage $V_{tc}$ and program threshold voltage $V_{tp}$ are plotted against time. Erased state curves 150 and 152 plot erase threshold voltage $V_{tc}$ against time for the prior art, thick bottom oxide, NROM cell 10 shown in FIG. 1, where the thicknesses of bottom oxide layer 109 are 8.3 nm and 5.3 nm respectively. Erased state curve 154 plots erase threshold voltage Vte against time for the thin bottom oxide NROM cell 128 shown in FIG. 4, where the thickness of bottom oxide layer 130 is 3.5 nm. Aside from the varying bottom oxide thicknesses, the three ONO structures had the same dimensions, growing conditions and compositions.

In FIG. 5A, curve 150 demonstrates the most dramatic increase in erase threshold voltage $V_{tc}$. Curves 150 and 152 both rise significantly above read level RD. This is of concern since the cells of the array become inoperable once erase threshold voltage $V_{tc}$ crosses a minimum margin level from read level RD.

In comparison, curve 154 demonstrates little or no increase in erase threshold voltage $V_{te}$ and thus, the cells of the array remain operable for a significantly longer period of time. In FIG. 5A, for example, the cells of curve 154 remain operable for a period of time at least three (3) orders of magnitude longer than those of curves 150 and 152.

A comparison of curves 150, 152 and 154 shows diminishing gate stress sensitivity with diminishing bottom oxide layer thickness Thus, the thin bottom oxide cells 128 may be relatively insensitive to gate stress (i.e. there is limited shift in erase threshold voltage $V_{tc}$) while thick bottom-oxide cells 10 may show a dramatic $V_t$ shift following gate stress. Thus, thin bottom oxide layer 130 may provide reduced gate stress sensitivity, i.e. a minor shift in erase threshold voltage $V_{tc}$ following gate stress after repeated cycling of programming and erasure.

Applicant has further realized that thin bottom oxide NROM cell 128 may exhibit less severe margin shifting and shrinkage following positive gate stress or bake treatment than prior art NROM cells. Applicant has realized that the character of the margin shift exhibited by thin bottom oxide NROM cell 128 may increase its product life.

FIG. 5A also graphs curves 151 and 153 which plot program threshold $V_{tp}$ against time for the prior art, thick bottom oxide, NROM cells 10. Programmed state curve 155 plots program threshold $V_{tp}$ against time for the thin bottom oxide NROM cell 128. It may be seen in FIG. 5A that, while the differences in $V_{tp}$ shift between curves 151, 153 and 155 are less extreme than the differences between the $V_{tc}$ shift curves 150, 152 and 154, the thin bottom oxide cell also has minimal $V_{tp}$ shift (curve 155).

The combination of a dramatically smaller shift in $V_{tc}$ and a moderately smaller shift in $V_{tp}$ for the thin bottom oxide structure in comparison with the prior art NROM cell may result in a window of operation WO for the thin bottom oxide structure which may undergo less shrinkage and less of a transactional shift than the thick bottom oxide structures. Applicant has realized that the more stable window of operation provided by the thin bottom oxide structure may provide a cell which is operative for a significantly longer period of time. This is discussed in more detail with respect to FIG. 5B.

Figure 5B:
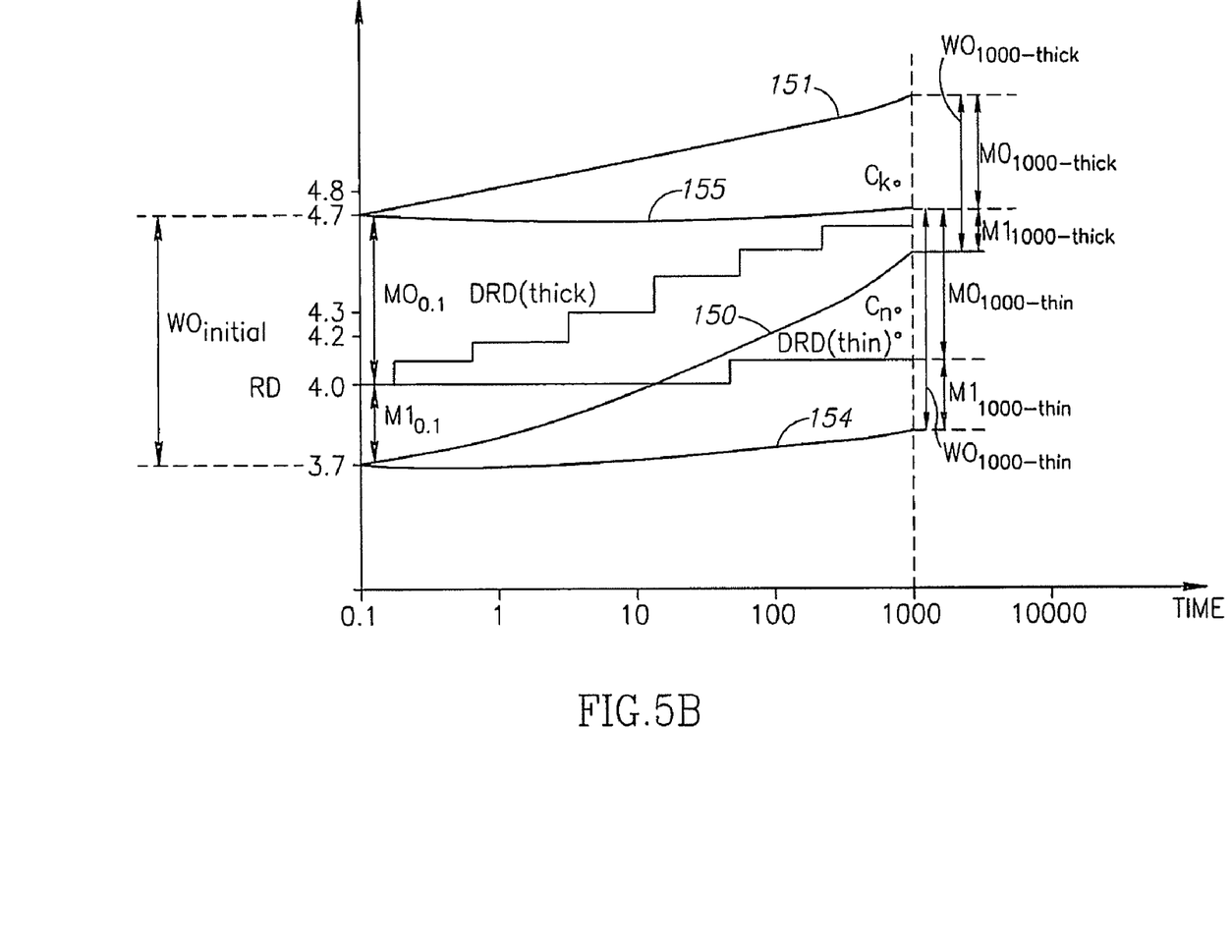
FIG. 5B is a graphical illustration of the curves of FIG. 5A for the inventive ONO structure and a moving read level.

As shown in FIG. 5B, the initial window of operation $WO_{initial}$ of both the standard and thin bottom oxide cells spans a range of approximately 1000 mV, from 3.7 V and 4.7 V. The range is centered at point $C_i$, which represents a center point in window of operation WO, and which is located at approximately 4.2 V. At t=1000 minutes, the window of operation of the thick bottom oxide cell, $WO_{1000-thick}$, is shown to have shrunk to a span of approximately 400 mV (between 4.6 and 5 V), and to have undergone a transactional shift so that its center point $C_k$ is located at 4.8 V, a transactional shift of 600 mV. The window of operation of the thin bottom oxide cell $WO_{1000-thin}$ is shown to have shrunk to a span of approximately 800 mV and to have undergone a transactional shift so that its center point $C_n$ is located at 4.3V, a transactional shift of only 100 mV.

Applicant has realized that a window of operation spanning 400 mV may be sufficient to differentiate between the erased state and the programmed state in an NROM cell. Such a window of operation exists for thin bottom oxide cell 128 for a significantly longer period of time (i.e. greater than 4 orders of magnitude) than for prior art, thick bottom oxide cell 10.

Applicant has realized that this more stable window of operation may be salvaged for use even after the window of operation has shifted above the original read level RD. As is disclosed in co-pending application Ser. No. 11/007,332, entitled "Method for Reading Non-Volatile Memory Cells", filed Dec. 9, 2004, the disclosure of which is incorporated herein by reference, this may be done by introducing a moving read level DRD which may be dynamically relocated during the gate stress test to optimize margins M0 and M1 for as long as possible As shown in FIG. 5B, for example, moving read level DRD(thick) for the thick bottom oxide cells is a step-wise function that rises from 4.0V to 4.6V in many steps. In contrast, moving read level DRD(thin) for the thin bottom oxide cells may be relocated from the original read level location at 4.0V to only 4.1V at 100 min. The combination of moving read level DRD and margins $M0_{1000\text{-}thin}$ and $M1_{1000\text{-}thin}$ may ensure reliable reads by ensuring reliable differentiation between the programmed and erased states of the cell. Moreover; the moving read level for thin bottom oxide cells may have fewer steps than for prior art cells.

Thus, an NROM cell may function for an extended time, with respect to the prior art, with a thin bottom oxide structure in combination with a moving read level. The thin bottom oxide structure may provide a window of operation of sufficient width and relatively minimally shifted, and the moving read level may enable utilization of that window by moving to the center of it, and allowing margins M0 and M1 of sufficient width to reside on either side of it.

Figure 6:
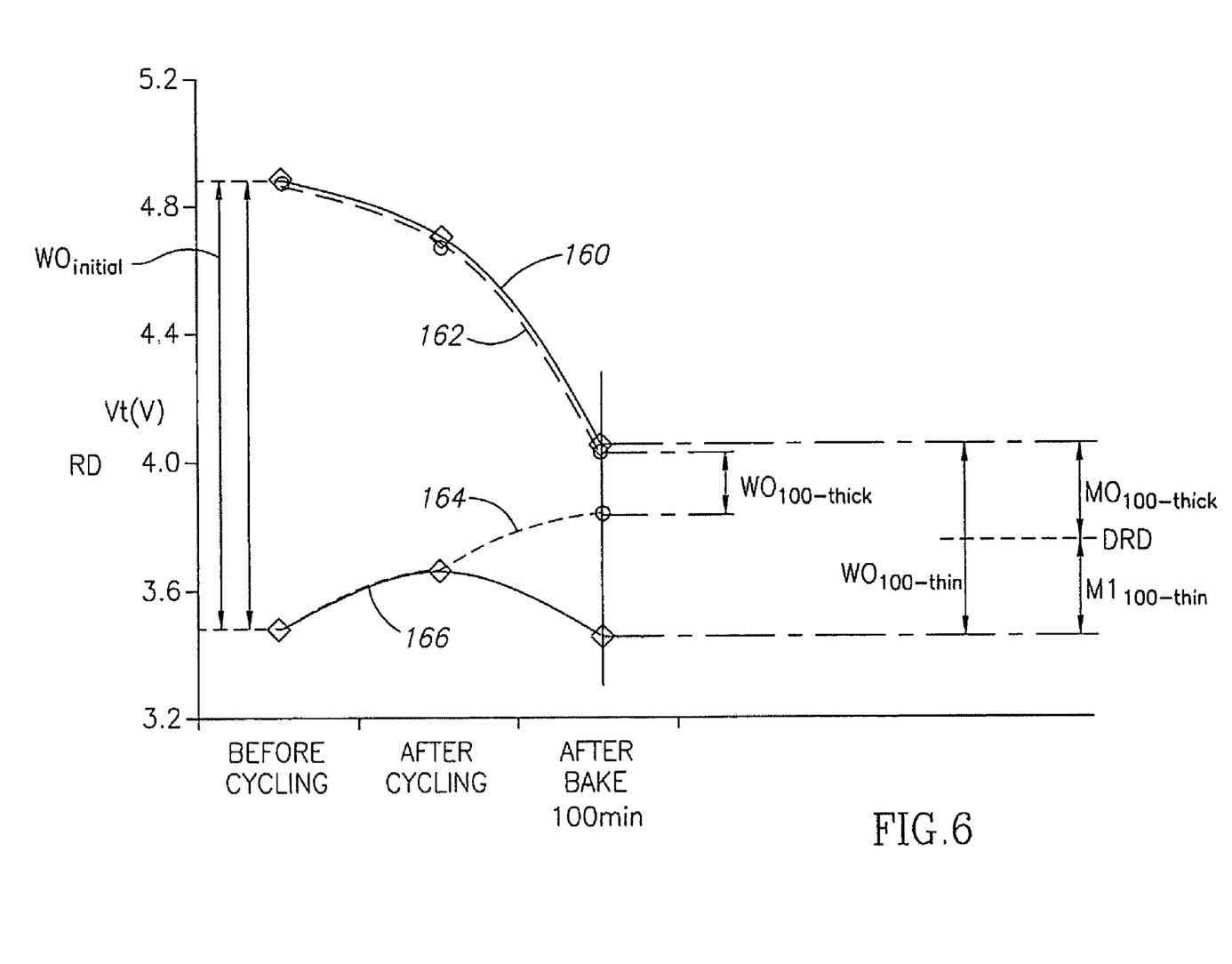
FIG. 6 is a graphical illustration of margin shrinkage and shift exhibited by NROM cells having different ONO structures as a result of bake treatment following multiple cycles of programming and erasing.

As discussed in the Background, margin stability after repeated cycles of programming and erasing may also be tested by bake treatment. The results of one exemplary bake treatment are shown in FIG. 6 to which reference is now made. FIG. 6 shows a comparison of the bake treatment sensitivities of three different ONO structures of NROM cells after multiple cycles of programming and erasure Erased state curves 164 and 166 plot erase threshold voltage $V_{tc}$ against time for the prior art, thick bottom oxide, NROM cell 10 and thin bottom oxide NROM cell 128, respectively. Programmed state curves 162 and 160 plot program threshold voltage $V_{tp}$ against time for the prior art, thick bottom oxide, NROM cell 10 and thin bottom oxide NROM cell 128 respectively.

Initially, at t=0, prior to cycling, the window of operation WO of the standard and thin bottom oxide NROM cells are shown to be $WO_{i\text{-}thick}$ and $WO_{i\text{-}thin}$ respectively. Following cycling and subsequent bake treatment, at t=100 minutes, the windows of operation WO of the thick and thin bottom oxide NROM cells are shown to be $WO_{100\text{-}thick}$ and $WO_{100\text{-}thin}$ respectively.

FIG. 6 shows that the windows of operation WO for both NROM cells shifted almost completely below the original read level RD at t=100 minutes after bake. However, due to the less extreme shift exhibited by the erase threshold voltage $V_{tc}$ curve for the thin bottom oxide cell, the thin bottom oxide cell maintains a wider window of operation, $WO_{100\text{-}thin}$, than that which remains for the prior art cell at the same time, $WO_{100\text{-}thick}$. For example, as shown in FIG. 6, $WO_{100\text{-}thin}$ may span a range of approximately 550 mV, while $WO_{100\text{-}thick}$ may span a range of only about 150 mV.

Similarly as for the situation encountered after a gate stress discussed in FIGS. 5A and 5B, Applicant has realized that NROM cells having a sufficient window of operation may be salvaged for use even after the window of operation may shift so that the original read level RD is located at either edge of window of operation WO, or even completely outside of it. In the case of FIG. 5A, during a gate stress test, $V_{tc}$ and $V_{tp}$ shifted upwards. In the case of FIG. 6, during bake treatment, $V_{tc}$ and $V_{tp}$ shifted downwards. In the situation of FIG. 5A the window of operation is located almost completely above read level RD, and in the situation of FIG. 6, the window of operation is located almost completely below read level RD. However, by implementing a moving read level DRD, relocated so as to maximize margins M0 and M1 within window of operation WO, the cells may remain operative for a longer period of time.

As shown in FIG. 6, for example, moving read level DRD may be shifted from its original location to a center point between the erase threshold voltage $V_{tc}$ and the program threshold voltage $V_{tp}$ curves at t=100, maximizing margin $M0_{100\text{-}thin}$ between program threshold voltage $V_{tp}$ and adjusted read level DRD and margin $M1_{100\text{-}thin}$ between erase threshold voltage $V_{tc}$ and adjusted read level DRD. The combination of adjusted read level DRD and margins $M0_{100\text{-}thin}$ and $M1_{100\text{-}thin}$ may ensure reliable reads by ensuring reliable differentiation between the programmed and erased states of the cell. Thus, an NROM cell may function for an extended time, with respect to the prior art, with a thin bottom oxide structure in combination with a moving read level. The thin bottom oxide structure may provide a window of operation of sufficient width and the moving read level may enable utilization of that window by moving to the center of it, and allowing margins M0 and M1 of sufficient width to reside on either side of it.

It will be appreciated that any bottom oxide thickness for which there is minimal $V_{tc}$ shift or margin stability is incorporated in the present invention.

It will further be appreciated that the phenomenon shown hereinabove are valid for single NROM cells, multiple cells in an array, single bit cells, dual bit cells, etc.

Figure 7A:
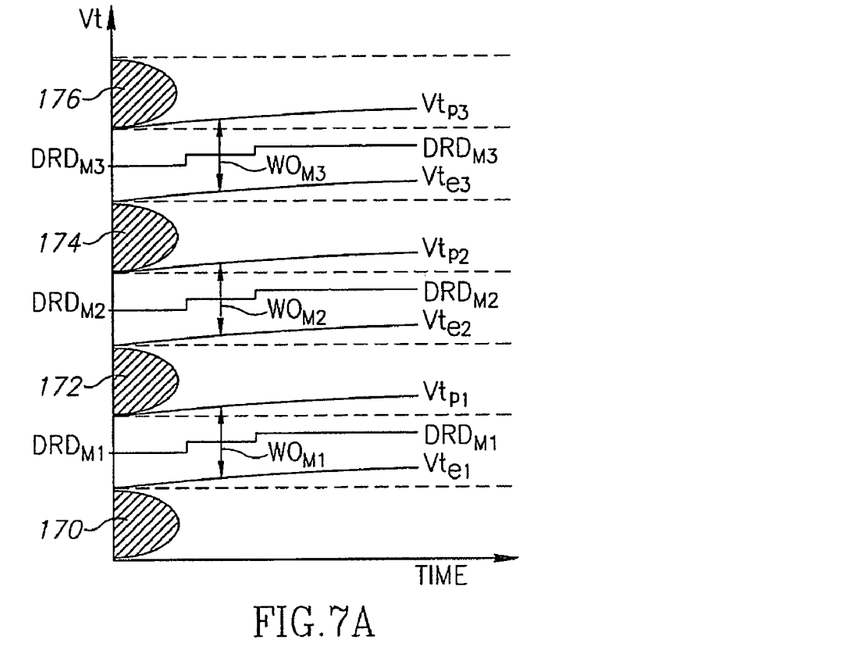
FIGS. 7A and 7B are graphical illustration of the operating ranges of a multi-level NROM cell, constructed and operative in accordance with a further preferred embodiment of the present invention.
Figure 7B:
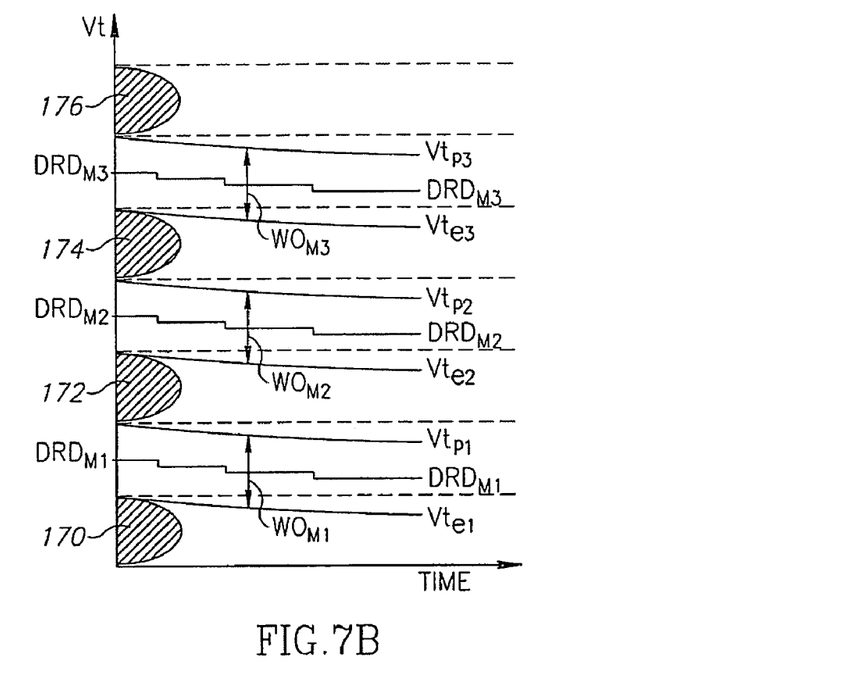

Reference is now made to FIGS. 7A and 7B which show how the margin stability in thin bottom oxide NROM cells may be useful in multi-level NROM cells. FIG. 7A graphs the threshold voltages over time for a positive gate stress test while FIG. 7B graphs the threshold voltages over time for a bake treatment.

Multi-level NROM cells are described in co-pending applications Ser. No. 10/695,449, entitled "Method, System and Circuit for Programming a Non-Volatile Memory Array" and Ser. No. 10/695,448 entitled "A Method, Circuit and System for Determining a Reference Voltage", both filed Oct. 29, 2003. Multi-level NROM cells may have multiple possible distributions of threshold voltages for each chargeable area 106 and 108. In FIGS. 7A and 7B, four distributions 170, 172, 174 and 176 are shown, corresponding to two bits of information.

In accordance with a preferred embodiment of the present invention, three moving read levels DRD are defined, each located between two neighboring distributions. Thus, $DRD_{m1}$ is located between $V_{tc1}$ and $V_{tp1}$, where $V_{tc1}$ may be defined as the leftmost bit of distribution 170 and $V_{tc1}$ may be defined as the rightmost bit of distribution 172. $DRD_{m2}$ is located between $V_{te2}$ and $V_{tp2}$, where $V_{te2}$ may be defined as the leftmost bit of distribution 172 and $V_{tp2}$ may be defined as the rightmost bit of distribution 174. Similarly for the $DRD_{m3}$. When reading or verifying the status of the chargeable area 106 or 108, the threshold voltage level is compared to all three read levels DRD in order to determine which distribution (170, 172, 174 or 176) the threshold voltage is currently in.

It will be appreciated that the windows of operation WO for each moving read level DRD may be maintained between two neighboring distributions and that, therefore, for the cell to work well, the distributions ideally should be maintained as far apart from each other as possible. These windows of operation are initially significantly narrower than the windows of operation shown in FIGS. 5 and 6 for single-level cells. Thus, any distributions that move or which significantly reduce the windows of operation will cause the multi-level NROM cell to cease to be functional It will be appreciated that the margin stability provided by the present invention may help to maintain the windows of operation WO of each multiple bit as far apart from each other as possible for a significantly long time. For example, 150 mV is believed to be a minimum window of operation.

FIGS. 7A and 7B graph threshold voltages $V_{tci}$ and $V_{tpi}$ over time. In both figures, the erase and program threshold voltage curves move in the same direction, though those of FIG. 7A (for positive gate stress) increase while those of FIG. 7B (bale treatment) decrease. In addition, the curves maintain minimum distances from each other. These two phenomena indicate the margin stability of the present invention. Even though the erase and program threshold voltages change, they change together and they maintain a sufficient distance apart from each other such that the windows of operation are maintained. In FIGS. 7A and 7B, moving read levels $DRD_{Mi}$ change, in a step-wise fashion, as the windows of operation change.

It will be appreciated that the combination of margin stability and moving read levels may provide a relatively long-lived multi-level NROM cell.

While certain features of the invention have been illustrated and described herein, many modifications, substitutions, changes, and equivalents will now occur to those of standard skill in the art. It is, therefore, to be understood that the appended claims are intended to cover all such modifications and changes as fall within the true spirit of the invention.

I claim:

1. An NROM (nitride read only memory) cell which is programmed by channel hot electron injection and erased by hot hole injection, the cell comprising; a charge trapping structure formed of; a bottom oxide layer; a charge trapping layer; and a top oxide layer; wherein said bottom oxide layer is no thicker than that which provides margin stability.

2. The cell of claim 1 and wherein said margin stability comprises a minimal shift in an erase and programmed threshold voltage of said cell during at least one of: a positive gate stress test and a bake treatment.

3. The cell of claim 1 and wherein said margin stability comprises an alignment of a shift in an erase threshold voltage V.sub.te with a shift in a programming threshold voltage V.sub.tp.

4. The cell of claim 1 and having a changing window of operation throughout a gate stress test or a bake treatment and also having a moving read level maintained within said changing window of operation.

5. The cell of claim 1 and having multiple changing windows of operation throughout a gate stress test or a bake treatment and also having different moving read levels maintained within each said changing window of operation.

6. The cell according to claim 1 and wherein said bottom oxide layer has a thickness is 2.5-3.5 run.

* * * * *